(12) United States Patent
Cheng et al.

(10) Patent No.: US 10,770,556 B2
(45) Date of Patent: Sep. 8, 2020

(54) FLUORINATED GRAPHENE PASSIVATED ALGAN/GAN-BASED HEMT DEVICE AND MANUFACTURING METHOD

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xinhong Cheng, Shanghai (CN); Lingyan Shen, Shanghai (CN); Zhongjian Wang, Shanghai (CN); Duo Cao, Shanghai (CN); Li Zheng, Shanghai (CN); Qian Wang, Shanghai (CN); Dongliang Zhang, Shanghai (CN); Jingjie Li, Shanghai (CN); Yuehui Yu, Shanghai (CN)

(73) Assignee: SHANGHAI INSTITUTE OF MICROSYSTEM AND INFORMATION TECHNOLOGY, CHINESE ACADEMY OF SCIENCE, Shanghai (CN)

( * ) Notice: Subject to any disclaimer, the term of this patent is extended or adjusted under 35 U.S.C. 154(b) by 114 days.

(21) Appl. No.: 15/772,033

(22) PCT Filed: Mar. 4, 2016

(86) PCT No.: PCT/CN2016/075635
§ 371 (c)(1),
(2) Date: Oct. 5, 2018

(87) PCT Pub. No.: WO2017/080126
PCT Pub. Date: May 18, 2017

(65) Prior Publication Data
US 2019/0035901 A1    Jan. 31, 2019

(30) Foreign Application Priority Data
Nov. 12, 2015    (CN) .......................... 2015 1 0772384

(51) Int. Cl.
*H01L 21/02*      (2006.01)
*H01L 21/338*      (2006.01)
(Continued)

(52) U.S. Cl.
CPC .......... *H01L 29/408* (2013.01); *H01L 29/205* (2013.01); *H01L 29/401* (2013.01);
(Continued)

(58) Field of Classification Search
CPC ........................ H01L 29/66431; H01L 29/778
(Continued)

(56) References Cited

U.S. PATENT DOCUMENTS

| 8,987,780 B2* | 3/2015 | Zhang | H01L 29/66431 257/183 |
| 9,685,513 B2* | 6/2017 | Kub | H01L 29/66462 |
| 2019/0312110 A1* | 10/2019 | Costa | H01L 21/02458 |

FOREIGN PATENT DOCUMENTS

| CN | 1557024 A | 12/2004 |
| CN | 103208425 A | 7/2013 |

(Continued)

*Primary Examiner* — Calvin Lee
(74) *Attorney, Agent, or Firm* — Global IP Services; Tianhua Gu

(57) ABSTRACT

An AlGaN/GaN HEMT based on fluorinated graphene passivation and a manufacturing method thereof. Monolayer graphene (108) is transferred to an AlGaN (104) surface, is treated by using fluoride ions and then is insulated to thereby replace a conventional nitride passivation layer. Then, a high-k material (109) is grown on the graphene (108), and the high-k material (109) and the graphene (108) are jointly used as a gate dielectric for preparing an AlGaN/GaN metal-insulator-semiconductor (MIS) HEMT. Compared (Continued)

with the traditional passivation structure, the graphene (108) has the advantages of small physical thickness (sub-nanometer scale) and low additional threshold voltage. The structure and the method are simple, the effect is remarkable and the application prospect in technical fields of microelectronics and solid-state electronics is wide.

11 Claims, 4 Drawing Sheets

(51) Int. Cl.
    *H01L 29/40*     (2006.01)
    *H01L 29/51*     (2006.01)
    *H01L 29/778*     (2006.01)
    *H01L 29/205*     (2006.01)
    *H01L 29/66*     (2006.01)
    *H01L 29/20*     (2006.01)

(52) U.S. Cl.
    CPC ...... *H01L 29/513* (2013.01); *H01L 29/66462* (2013.01); *H01L 29/7786* (2013.01); *H01L 29/7787* (2013.01); *H01L 29/2003* (2013.01); *H01L 29/517* (2013.01)

(58) Field of Classification Search
    USPC ......... 438/172, 180, 604; 257/189, 200, 641
    See application file for complete search history.

(56) References Cited

FOREIGN PATENT DOCUMENTS

| CN | 103247689 A | 8/2013 |
|----|-------------|--------|
| CN | 105304689 A | 2/2016 |

\* cited by examiner

FLUORINATED GRAPHENE PASSIVATED ALGAN/GAN-BASED HEMT DEVICE AND MANUFACTURING METHOD

CROSS REFERENCE TO RELATED PATENT APPLICATION

The present application is the US national stage of PCT/CN2016/075635 filed on Mar. 4, 2016, which claims the priority of the Chinese patent application No. CN2015107723843 filed on Nov. 12, 2015, which application is incorporated herein by reference.

BACKGROUND OF THE PRESENT INVENTION

Field of Invention

The present invention belongs to technical field of microelectronic and solid-state electronic, and in particular relates to an AlGaN/GaN HEMT based on fluorinated graphene passivation and manufacturing method thereof.

Description of Related Arts

High Electron Mobility Transistor (HEMT) is a heterojunction-field effect transistor, which is also called as a Modulation-Doped Field Effect Transistor (MODFET), a 2-Dimensional Electron Gas Field Effect Transistor (2-DEGFET), Selectively-Doped Heterojunction Transistor (SDHT), etc. This device and integrated circuits thereof can work at an ultrahigh frequency (millimeter wave) and ultrahigh rate, because they work by using two-dimensional electron gas with very high mobility.

The basic structure of HEMT is a modulation-doped heterojunction. High-mobility 2-Dimensional Electron Gas (2-DEG) exists in the modulation-doped heterojunction. This 2-DEG not only has very high mobility, but also is not "frozen" at extremely low temperature, and thus HEMT has very good low-temperature performance and can be used for low-temperature researches (such as on fractional quantum Hall effect). HEMT is a voltage control device, gate voltage Vg can control depth of a heterojunction potential well, thus surface density of 2-DEG in the potential well can be controlled and thus the working current of the device is controlled. For HEMT of a GaAs system, an n-AlxGa1-xAs control layer therein usually should be depleted (thickness is generally hundreds of nanometers and doping concentration is $10^7$-$10^8$/cm$^3$). If the thickness of the n-AlxGa1-xAs control layer is large and the doping concentration is high, 2-DEG exists when Vg=0, and the device is a depletion device; contrarily, the device is an enhancement device (when Vg=0, Schottky depletion layer extends to the inside of an i-GaAs layer); and however, if the thickness of the layer is too large and the doping concentration is too high, 2-DEG cannot be depleted during working and leakage resistance associated with S-D will appear. To sum up, for HEMT, the key is to well control the doping concentration and thickness of wide band gap semiconductor layer-control layer, especially the thickness. When the surface density Ns of 2-DEG in HEMT is considered, usually two two-dimensional energy bands (i=0 and 1) in the heterojunction potential well only need to be considered. The surface charge density Ns of 2-DEG will be controlled by the gate voltage Vg.

Good high-frequency high-power performance of AlGaN/GaN HEMT makes it very competitive in the fields of microwave power amplifiers and high-temperature digital circuits. Due to strong spontaneous polarization and piezoelectric polarization of the AlGaN/GaN heterojunction, high-concentration two-dimensional electron gas exists at an AlGaN/GaN interface. As compared with Si-based and GaAs-based devices, the output power density of AlGaN/GaN HEMTis increased by a magnitude.

However, due to the existence of surface electron traps, unpassivated AlGaN/GaN HEMT usually presents serious current collapse phenomena and the output performance is greatly reduced.

Based on above, it is really necessary to provide an AlGaN/GaN HEMTcapable of effectively inhibiting a current collapse effect and a method for manufacturing the same.

SUMMARY OF THE PRESENT INVENTION

In view of the above-mentioned disadvantages of the prior art, the purpose of the present invention is to provide a fluorinated graphene passivated AlGaN/GaN HEMT and a method for manufacturing the same, which are used for solving the problem that the AlGaN/GaN HEMT in the prior art has a serious current collapse effect.

In order to realize the above-mentioned purpose and other related purposes, the present invention provides an AlGaN/GaN HEMT based on fluorinated graphene passivation, and the HEMT comprises: a substrate; a GaN layer located above the substrate; an AlGaN layer bonded to the GaN layer, an interface between the AlGaN layer and the GaN layer forming a two-dimensional electron gas surface; a source and a drain formed at two ends of the AlGaN layer; an insulated graphene passivation layer bonded to a surface of the AlGaN layer; a gate dielectric layer bonded to a surface of the insulated graphene passivation layer; and a gate metal layer bonded to a surface of the gate dielectric layer.

As a preferred solution of the AlGaN/GaN HEMT based on fluorinated graphene passivation provided by the present invention, a buffer layer is provided between the substrate and the GaN layer.

As a preferred solution of the AlGaN/GaN HEMT based on fluorinated graphene passivation provided by the present invention, the substrate comprises a silicon substrate in a (111) crystal orientation.

As a preferred solution of the AlGaN/GaN HEMT based on fluorinated graphene passivation provided by the present invention, a thickness range of the buffer layer is 2-10 μm.

As a preferred solution of the AlGaN/GaN HEMT based on fluorinated graphene passivation provided by the present invention, the gate dielectric layer is a high-k dielectric layer.

The present invention further provides a manufacturing method for AlGaN/GaN HEMT based on fluorinated graphene passivation, and the method comprises the following steps: 1) providing a substrate and sequentially forming a GaN layer and an AlGaN layer on a surface of the substrate, an interface between the GaN layer and the AlGaN layer forming a two-dimensional electron gas surface; 2) forming a source ohmic contact and a drain ohmic contact on the AlGaN layer; 3) forming graphene on a surface of the AlGaN layer and performing fluorination treatment to the graphene to form an insulated graphene passivation layer; 4) forming a gate dielectric layer on a surface of the insulated graphene passivation layer and forming a gate metal layer on a surface of the gate dielectric layer; 5) performing mesa isolation to a device region; 6) depositing an isolating layer on a surface of the device; 7) etching windows corresponding to the source ohmic contact, the drain ohmic contact and the gate metal layer in the isolating layer; and 8) manufacturing metal extraction electrodes based on each window.

As a preferred solution of the manufacturing method for the AlGaN/GaN HEMT based on fluorinated graphene passivation provided by the present invention, step 1) further comprises a step of forming a buffer layer between the substrate and the GaN layer.

As a preferred solution of the manufacturing method for the AlGaN/GaN HEMT based on fluorinated graphene passivation provided by the present invention, methods for covering the surface of the AlGaN layer with graphene in step 3) include the following two methods: a. growing graphene on a Cu substrate and then transferring the graphene grown on the Cu substrate to the surface of the AlGaN layer; or b. directly growing graphene on the surface of the AlGaN layer.

As a preferred solution of the manufacturing method for the AlGaN/GaN HEMT based on fluorinated graphene passivation provided by the present invention, step 3) of performing fluorination treatment to the graphene comprises the following step: treating the graphene by using SF6 plasmas, treatment time being 60-120 s.

As a preferred solution of the manufacturing method for the AlGaN/GaN HEMT based on fluorinated graphene passivation provided by the present invention, the gate dielectric layer is a high-k gate dielectric layer.

As described above, the AlGaN/GaN HEMT based on fluorinated graphene passivation and the manufacturing method thereof provided by the present invention have the following beneficial effects: monolayer graphene is transferred to an AlGaN surface, is treated by using fluoride ions and then is insulated to thereby replace a conventional nitride passivation layer. After that, a high-k material is grown on the graphene, and the high-k material and the graphene are jointly used as a gate dielectric for preparing an AlGaN/GaN metal-insulator-semiconductor (MIS) HEMT. Compared with the traditional passivation structure, the graphene has the advantages of small physical thickness (sub-nanometer scale) and low additional effect on threshold voltage. Meanwhile, the single-layer graphene also has very good isolation performance and can prevent the AlGaN surface from being oxidized in the growth process of the high-k material to produce surface traps, so as to achieve a passivation effect. In addition, the fluorinating process can introduce negative charges into the graphene, the positive shift of threshold voltage of the HEMT is facilitated, and a possibility is provided for realizing an enhancement device. The structure and the method are simple, the effect is remarkable, and the application prospect in technical fields of microelectronics and solid-state electronics is wide.

DESCRIPTION OF COMPONENT MARK NUMBERS

Figure 1:
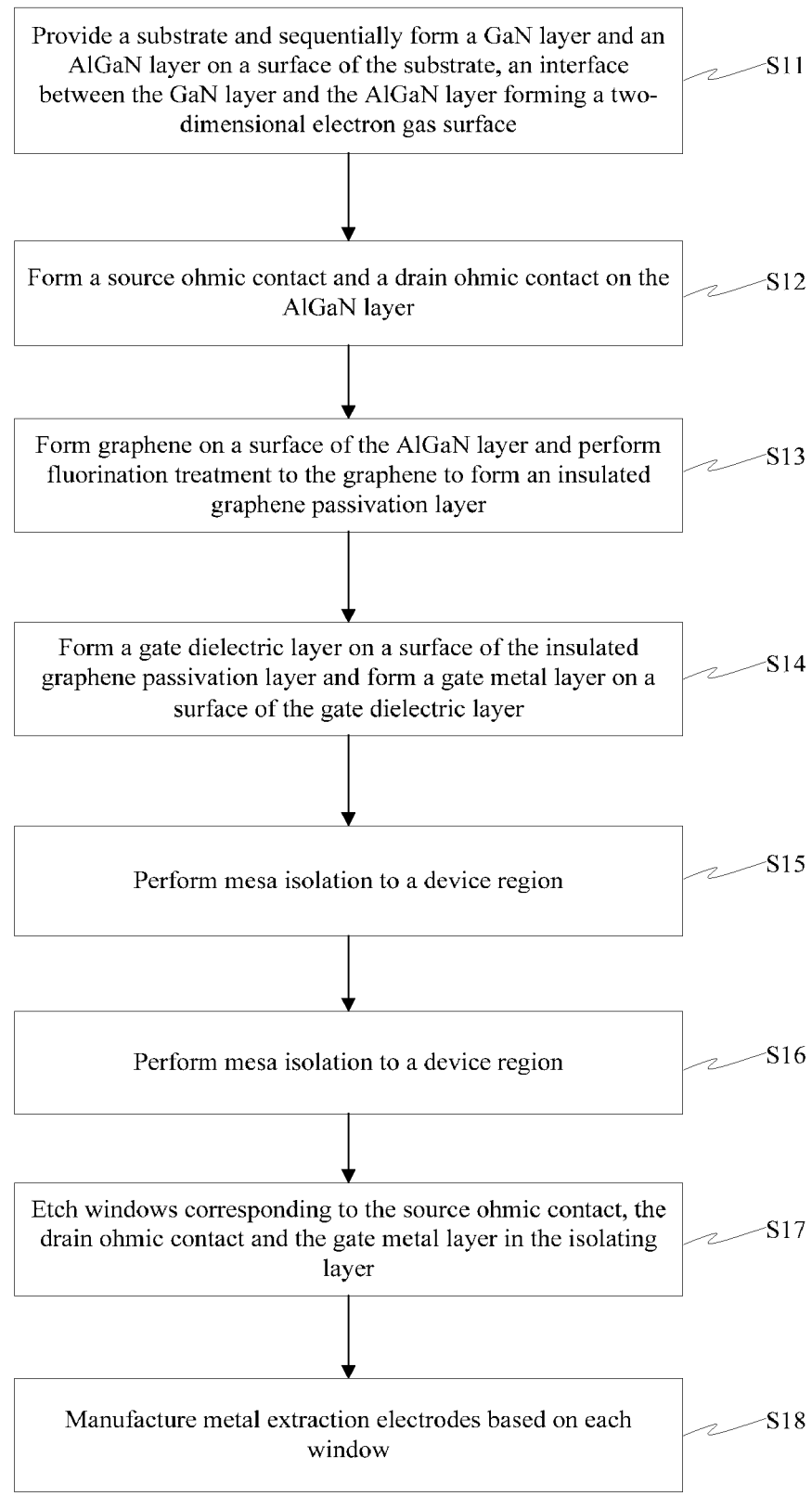
FIG. 1 illustrates a flowchart of steps of a method for manufacturing an AlGaN/GaN HEMT based on fluorinated graphene passivation provided by the present invention.

101 Substrate
102 Buffer layer
103 GaN layer
104 Two-dimensional electron gas surface
105 AlGaN layer
106 Source
107 Drain
108 Insulated graphene passivation layer
109 Gate dielectric layer
110 Gate metal layer
S11-S18 Steps 1) to step 8)

DETAILED DESCRIPTION OF THE PREFERRED EMBODIMENTS

The implementation modes of the present invention will be described below through specific examples. One skilled in the art can easily understand other advantages and effects of the present invention according to content disclosed in the description. The present invention may also be implemented or applied through other different specific implementation modes. Various modifications or variations may be made to all details in the description based on different points of view and applications without departing from the spirit of the present invention.

Please refer to FIG. 1 to FIG. 7. It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

Figure 5:
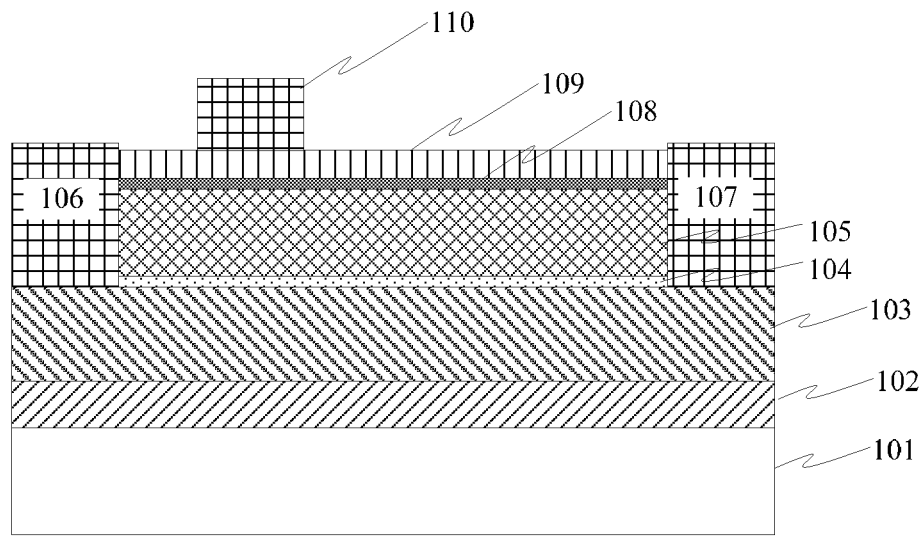

As illustrated in FIG. 5, this embodiment provides an AlGaN/GaN HEMT based on fluorinated graphene passivation, and the HEMT comprises: a substrate 101; a GaN layer 103 located above the substrate 101; an AlGaN layer 104 bonded to the GaN layer 103, an interface between the AlGaN layer 104 and the GaN layer 103 forming a two-dimensional electron gas surface; a source 106 and a drain 107 formed at two ends of the AlGaN layer 104; an insulated graphene passivation layer 108 bonded to a surface of the AlGaN layer 104; a gate dielectric layer 109 bonded to a surface of the insulated graphene passivation layer 108; and a gate metal layer 110 bonded to a surface of the gate dielectric layer 109.

As illustrated in FIG. 5, as an example, a buffer layer 102 is provided between the substrate 101 and the GaN layer 103. The buffer layer 102 can effectively buffer stress mismatch and lattice mismatch between the substrate 101 and the GaN layer 103, and thus greatly improve the growth quality of the GaN layer 103.

As an example, the substrate 101 comprises a silicon substrate in a (111) crystal orientation. Of course, in other embodiments, the substrate 101 may also be a SiC substrate or the like and is not limited to the example here.

As an example, a thickness range of the buffer layer 102 is 2-10 μm. In this embodiment, the thickness of the buffer layer 102 is 3.9 μm.

As an example, the gate dielectric layer 109 is a high-k dielectric layer 109. The high-k dielectric layer 109 may be $Al_2O_3$, $HfO_2$ or the like, and is not limited to the example here.

In the present invention, the insulated graphene passivation layer 108 is used for replacing a conventional nitride passivation layer, then a high-k material is grown on the insulated graphene passivation layer 108, and the high-k material and the insulated graphene passivation layer 108 are jointly used as a gate dielectric for forming an AlGaN/GaN metal-insulator-semiconductor (MIS) HEMT. Compared with the traditional passivation structure, the graphene has the advantages of small physical thickness (sub-nanometer scale) and low additional threshold voltage. Meanwhile, the monolayer graphenealso has very good isolation performance and can prevent the AlGaN surface from being oxidized in the growth process of the high-k material to produce surface traps, so as to achieve a passivation effect. In addition, the fluorinating process can introduce negative charges into the graphene, the positive shift of threshold voltage of the HEMT is facilitated and a possibility is provided for realizing an enhancement mode.

Figure 2:
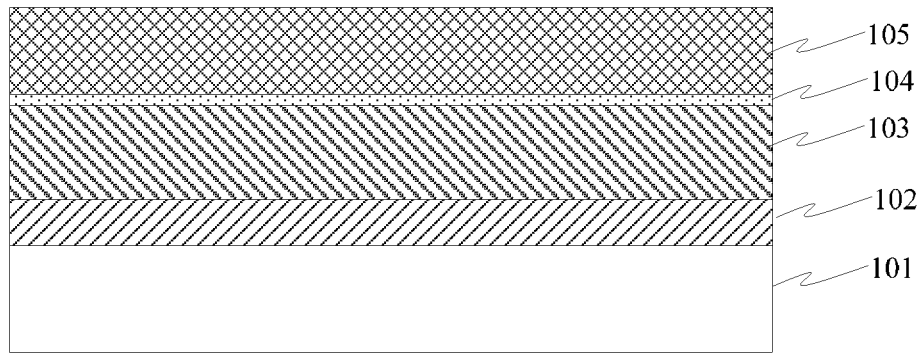
FIG. 2 to FIG. 5 illustrates structural schematic views in steps of a method for AlGaN/GaN HEMT based on fluorinated graphene passivation provided by the present invention.

As illustrated in FIG. 1 to FIG. 5, this invention further provides a method for manufacturing AlGaN/GaN HEMT based on fluorinated graphene passivation, and the method comprises the following steps:

As illustrated in FIG. 1 and FIG. 2, firstly step 1) S11 is performed, i.e., a substrate 101 is provided and a GaN layer 103 and an AlGaN layer 104 are sequentially formed on a surface of the substrate 101, wherein an interface between the GaN layer 103 and the AlGaN layer 104 forms a two-dimensional electron gas surface.

In this embodiment, the method further comprises a step of forming a buffer layer 102 between the substrate 101 and the GaN layer 103. The buffer layer 102 can effectively buffer stress mismatch and lattice mismatch between the substrate 101 and the GaN layer 103, and thus greatly improve the growth quality of the GaN layer 103.

Figure 3:
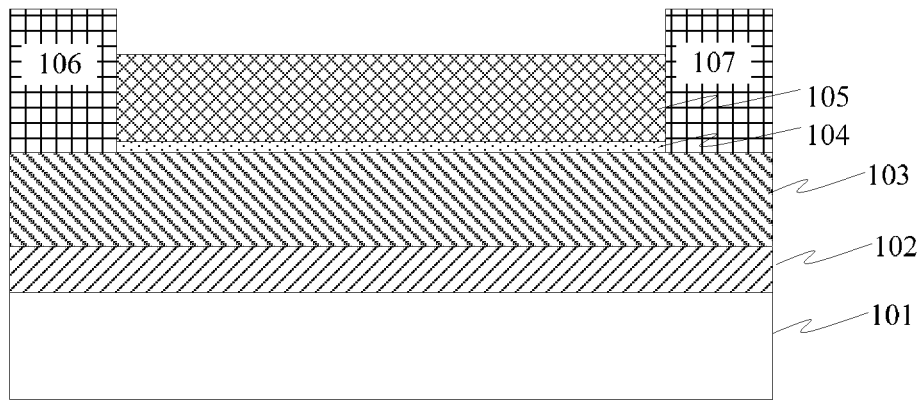

As illustrated in FIG. 1 and FIG. 3, then step 2) S12 is performed, i.e., a source ohmic contact and a drain ohmic contact are formed on the AlGaN layer 104.

Specifically, firstly a photoresist pattern is manufactured, then Ti/Al/Ni/Au metal lamination layers (the thicknesses of which are respectively 20/100/50/100 nm) are evaporated by adopting electron beams, then excess metal lamination layers are removed by adopting a lift-off process, annealing is performed, and then a source ohmic contact and a drain ohmic contact are formed on the AlGaN layer 104.

Figure 4:
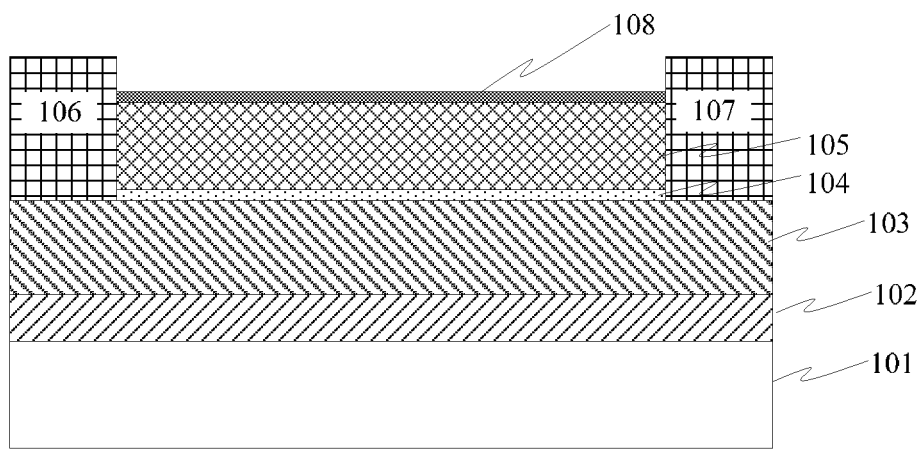

As illustrated in FIG. 1 and FIG. 4, then step 3) S13 is performed, i.e., graphene is formed on a surface of the AlGaN layer 104 and fluorination treatment is performed to the graphene to form an insulated graphene passivation layer 108.

As an example, the step of forming the graphene on the surface of the AlGaN layer 104 comprises: growing graphene on a Cu substrate 101; and then transferring the graphene grown on the Cu substrate 101 to the surface of the AlGaN layer 104.

As an example, the step of performing fluorination treatment to the graphene comprises the following step: treating the graphene by using SF6 plasmas, wherein treatment time is 60-120 s. In this embodiment, the treatment time is selected to be 90 s.

As illustrated in FIG. 1 and FIG. 5, then step 4) S14 is performed, i.e., a gate dielectric layer 109 is formed on a surface of the insulated graphene passivation layer 108 and a gate metal layer 110 is formed on a surface of the gate dielectric layer 109.

As an example, the gate dielectric layer 109 is a high-k dielectric layer 109. The high-k dielectric layer 109 may be Al2O3, HfO2 or the like, and is not limited to the example here. Specifically, in this embodiment, firstly $Al_2O_3$ is deposited to certain thickness by adopting hot-process ALD (Atomic Layer Deposition), then $Al_2O_3$ is continuously deposited by adopting plasma enhanced atomic layer deposition, and an $Al_2O_3$ layer with total deposition thickness of 14 nm is deposited, and the $Al_2O_3$ layer and the insulated graphene passivation layer 108 are jointly used as a gate dielectric layer 109.

As an example, the step of forming a dielectric metal layer 110 on the surface of the gate dielectric layer 109 comprises the following steps: firstly a photoresist pattern is manufactured, then Ni/Au metal lamination layers (the thicknesses of which are respectively 30/100 nm) are evaporated by adopting electron beams, and finally excess metal lamination layers are removed by adopting a lift-off process, so as to complete the preparation of the gate metal layer 110.

As illustrated in FIG. 1, then step 5) S15 is performed, i.e., mesa isolation is performed to a device region.

Specifically, $SiO_2$ which is used as a mask is deposited by adopting a PECVD process, the thickness thereof is 300 nm, then a non-device region is etched by adopting ICP, and the etching depth is 350 nm, so as to complete the mesa isolation to the device region.

As illustrated in FIG. 1, then step 6) S16 is performed, i.e., an isolating layer is deposited on a surface of the device.

As an example, a $SiO_2$ thin film is deposited by adopting a PECVD process and is used as an isolating layer, and the thickness thereof is 100 nm.

As illustrated in FIG. 1, then step 7) S17 is performed, i.e., windows corresponding to the source ohmic contact, the drain ohmic contact and the gate metal layer 110 are etched in the isolating layer.

Specifically, firstly the ohmic contacts and the $SiO_2$ thin film on the gate metal electrode are etched by adopting an RIE method, and then the $Al_2O_3$ layer on the source ohmic contact and the drain ohmic contact is etched to etch windows corresponding to the source ohmic contact, the drain ohmic contact and the gate metal layer 110 in the isolating layer.

As illustrated in FIG. 1, finally step 8) S18 is performed, i.e., metal extraction electrodes are manufactured based on each window.

Specifically, firstly a photoresist pattern is manufactured, then Ti/Au metal lamination layers (the thicknesses of which are respectively 20/200 nm) are evaporated by adopting electron beams, and finally excess metal lamination layers are removed by adopting a lift-off process, so as to manufacture metal extraction electrodes in each window and complete the manufacturing of the fluorinated graphene passivated AlGaN/GaN HEMT.

Figure 6:
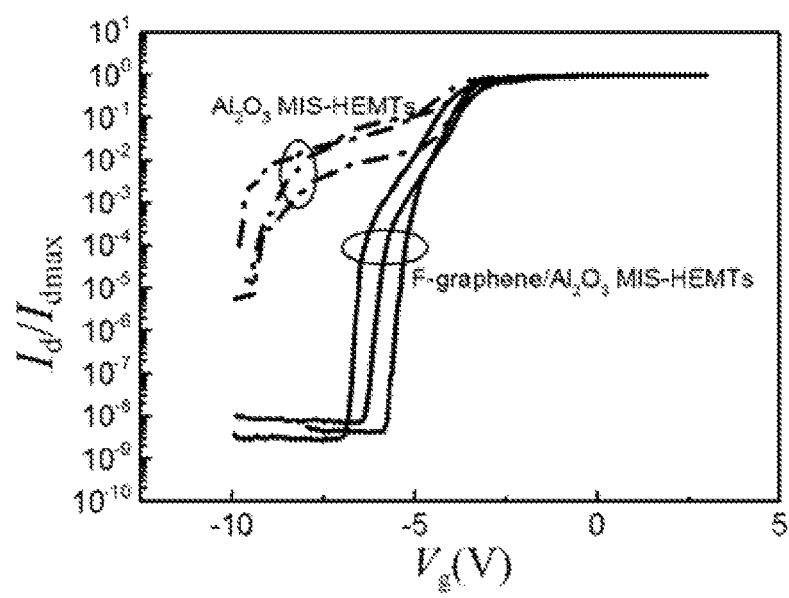
FIG. 6 and FIG. 7 illustrate I-V performance curve comparison charts of an AlGaN/GaN HEMT based on fluorinated graphene passivation provided by the present invention and a non-graphene passivated HEMT.
Figure 7:
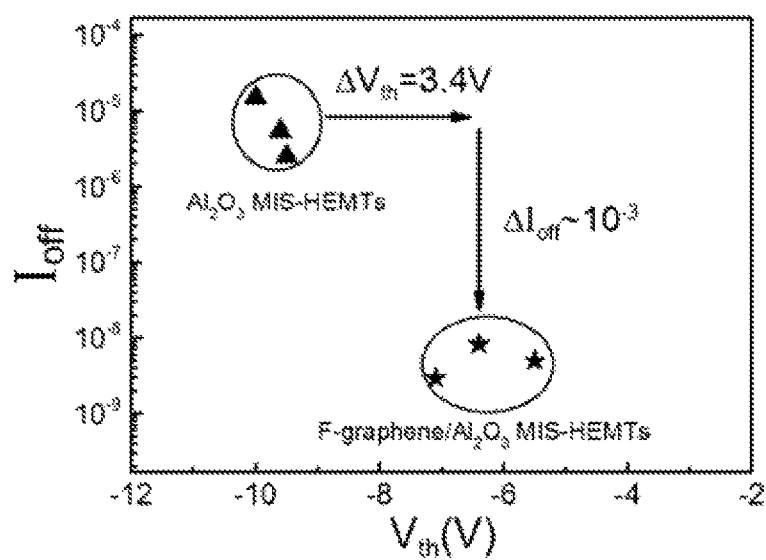

FIG. 6 and FIG. 7 illustrate I-V performance curve comparison charts of an AlGaN/GaN HEMT based on fluorinated graphene passivation provided by the present invention and a non-graphene passivated HEMT. In FIG. 6, the transfer characteristics of a non-graphene passivated MIS HEMT are compared with that of the HEMT provided by the present invention, and it is found that off-state current of the graphene passivated device is decreased by three orders of magnitude, and the threshold voltage is positively shifted by 3.4V as illustrated in FIG. 7; and from FIG. 6 to FIG. 7, it can be seen that the performance of the HEMT provided by the present invention is obviously improved.

As described above, the AlGaN/GaN HEMT based on fluorinated graphene passivation and the manufacturing method thereof provided by the present invention have the following beneficial effects: monolayer graphene is transferred to an AlGaN surface, and is treated by using fluoride ions, and then is insulated to thereby replace a conventional nitride passivation layer. After that, a high-k material is grown on the graphene, and the high-k material and the graphene are jointly used as a gate dielectric for preparing an AlGaN/GaN metal-insulator-semiconductor (MIS) HEMT. Compared with the traditional passivation structure, the graphene has the advantages of small physical thickness (sub-nanometer scale) and low additional threshold voltage. Meanwhile, the single-layer graphene also has very good isolation performance and can prevent the AlGaN surface from being oxidized in the growth process of the high-k material to produce surface traps, so as to achieve a passivation effect. In addition, the fluorinating process can introduce negative charges into the graphene, the positive shift of threshold voltage of the HEMT is facilitated and a possibility is provided for realizing an enhancement device. The structure and the method are simple, the effect is remarkable and the application prospect in technical fields of microelectronics and solid-state electronics is wide. Therefore, the present invention effectively overcomes various disadvantages in the prior art and thus has a great industrial utilization value.

The above-mentioned embodiments are just used for exemplarily describing the principle and effect of the present invention instead of limiting the present invention. One skilled in the art may make modifications or changes to the above-mentioned embodiments without departing from the spirit and scope of the present invention. Therefore, all equivalent modifications or changes made by those who have common knowledge in the art without departing from the spirit and technical thought disclosed by the present invention shall be still covered by the claims of the present invention.

What is claimed is:

1. An AlGaN/GaN HEMT based on fluorinated graphene passivation, characterized in that the HEMT comprises:
   a substrate;
   a GaN layer located above the substrate;
   an AlGaN layer bonded to the GaN layer, a two-dimensional electron gas surface formed by an interface between the AlGaN layer and the GaN layer;
   a source and a drain formed at two ends of the AlGaN layer;
   an insulated graphene passivation layer bonded to a surface of the AlGaN layer, wherein the insulated graphene passivation layer is fluorinated;
   a gate dielectric layer bonded to a surface of the insulated graphene passivation layer; and
   a gate metal layer bonded to a surface of the gate dielectric layer.

2. A method for manufacturing AlGaN/GaN HEMT based on fluorinated graphene passivation of claim 1, characterized in that the method comprises the following steps:
   1) providing a substrate and sequentially forming a GaN layer and an AlGaN layer on a surface of the substrate, an interface between the GaN layer and the AlGaN layer forming a two-dimensional electron gas surface;
   2) forming a source ohmic contact and a drain ohmic contact on the AlGaN layer;
   3) covering a surface of the AlGaN layer with graphene and performing fluorination treatment to the graphene to form an insulated graphene passivation layer; and
   4) forming a gate dielectric layer on a surface of the insulated graphene passivation layer and forming a gate metal layer on a surface of the gate dielectric layer.

3. The manufacturing method for the AlGaN/GaN HEMT based on fluorinated graphene passivation of claim 1 according to claim 2, characterized in that the method further comprises the following steps:
   5) performing mesa isolation to a device region;
   6) depositing an isolating layer on a surface of the device;
   7) etching windows corresponding to the source ohmic contact, the drain ohmic contact and the gate metal layer in the isolating layer; and
   8) manufacturing metal extraction electrodes based on each window.

4. The manufacturing method for the AlGaN/GaN HEMT based on fluorinated graphene passivation of claim 1 according to claim 2, characterized in that method for covering the surface of the AlGaN layer with graphene in step 3) is selected from: a. growing graphene on a Cu substrate and then transferring the graphene grown on the Cu substrate to the surface of the AlGaN layer; or b. directly growing graphene on the surface of the AlGaN layer.

5. The manufacturing method for the AlGaN/GaN HEMT based on fluorinated graphene passivation of claim 1 according to claim 2, characterized in that step 3) of performing fluorination treatment to the graphene comprises the following step: treating the graphene by using SF6 plasmas, treatment time being 60-120 s.

6. The manufacturing method for the AlGaN/GaN HEMT based on fluorinated graphene passivation of claim 1 according to claim 2, characterized in that step 1) further comprises a step of forming a buffer layer between the substrate and the GaN layer.

7. The manufacturing method for the AlGaN/GaN HEMT based on fluorinated graphene passivation of claim 1 according to claim 2, characterized in that the gate dielectric layer is a high-k gate dielectric layer.

8. The AlGaN/GaN HEMT based on fluorinated graphene passivation according to claim 1, characterized in that the substrate comprises a silicon substrate in a (111) crystal orientation.

9. The AlGaN/GaN HEMT based on fluorinated graphene passivation according to claim 1, characterized in that the gate dielectric layer is a high-k dielectric layer.

10. The AlGaN/GaN HEMT based on fluorinated graphene passivation according to claim 1, characterized in that a buffer layer is provided between the substrate and the GaN layer.

11. The AlGaN/GaN HEMT based on fluorinated graphene passivation according to claim 10, characterized in that a thickness range of the buffer layer is 2-10 μm.

* * * * *